United States Patent [19]
Gupta et al.

[11] Patent Number: 5,902,494
[45] Date of Patent: May 11, 1999

[54] METHOD AND APPARATUS FOR REDUCING PARTICLE GENERATION BY LIMITING DC BIAS SPIKE

[75] Inventors: Anand Gupta, San Jose; Stefan Wolff, Sunnyvale; Maria Galiano, San Jose, all of Calif.

[73] Assignee: Applied Materials, Inc., Santa Clara, Calif.

[21] Appl. No.: 08/599,279

[22] Filed: Feb. 9, 1996

[51] Int. Cl.⁶ .............................. C23C 16/52; H05H 1/46
[52] U.S. Cl. ..................... 216/67; 118/723 E; 156/345; 427/569
[58] Field of Search ................ 204/298.07, 298.08, 204/298.33, 298.34; 134/12, 1.3; 156/345; 438/714; 118/704, 723 E, 723 I, 722; 427/569, 570, 571, 575; 216/67.68, 69, 70, 71

[56] References Cited

U.S. PATENT DOCUMENTS

| | | | |
|---|---|---|---|
| 4,566,941 | 1/1986 | Yoshida et al. | 156/345 |
| 4,761,219 | 8/1988 | Sasaki et al. | 204/298 |
| 4,795,529 | 1/1989 | Kawasaki et al. | 156/643 |
| 4,871,416 | 10/1989 | Fukuda | 156/635 |
| 4,951,601 | 8/1990 | Maydan et al. | 118/719 |
| 4,985,112 | 1/1991 | Egitto et al. | 156/643 |
| 4,985,372 | 1/1991 | Narita | 437/192 |
| 5,043,300 | 8/1991 | Nulman | 437/200 |
| 5,049,251 | 9/1991 | Inoue | 204/192.12 |
| 5,083,865 | 1/1992 | Kinney et al. | 356/338 |
| 5,089,441 | 2/1992 | Moslehi | 437/225 |
| 5,102,496 | 4/1992 | Savas | 156/643 |
| 5,143,866 | 9/1992 | Matsutani | 437/187 |
| 5,221,425 | 6/1993 | Blanchard et al. | 156/643 |
| 5,328,555 | 7/1994 | Gupta | 156/643 |
| 5,427,621 | 6/1995 | Gupta | 134/1 |
| 5,456,796 | 10/1995 | Gupta et al. | 156/643.1 |
| 5,573,597 | 11/1996 | Lantsman | 118/723 MP |
| 5,622,595 | 4/1997 | Gupta et al. | 438/710 |
| 5,637,190 | 6/1997 | Liao | 438/726 |
| 5,716,484 | 2/1998 | Blackburn et al. | 156/345 |

FOREIGN PATENT DOCUMENTS

| | | | |
|---|---|---|---|
| 0425419 | 5/1991 | European Pat. Off. | C23C 16/50 |
| 0453780 | 10/1991 | European Pat. Off. | H01J 37/32 |
| 4128779 | 3/1992 | Germany | C23F 4/00 |
| 60-42831 | 3/1985 | Japan | H01L 21/302 |
| 61-196538 | 8/1986 | Japan | H01L 21/302 |
| 63-1035 | 1/1988 | Japan | H01L 21/302 |

OTHER PUBLICATIONS

Selwyn et al. Rastered laser light scattering studies . . . J. Vac. Sci. Technol. A, vol. 9, No. 5, pp. 2817–2824, Sep./Oct. 1991.

Selwyn et al., "In–situ Particulate Contamination Studies in Process Plasmas", *SPIE Conference Proc.*, pp. 1–12, (Oct. 1989).

Selwyn, "Laser Diagnostic Techniques for Reactive Ion Etching: Plasma Understanding to Process Control", *J. Vac. Sci. Technol. A*, vol. 6, No. 3, pp. 2041–2046, (May/Jun. 1988).

"IBM Reveals Design for Self–Cleaning Tools", *Semiconductor International*, p. 46, (Sep. 1991).

Selwyn et al., "In Situ Plasma Contamination Measurements by HeNe Laser Light Scattering: A Case Study", *J. Vac. Sci. Technol. A*, vol. 8, No. 3, p. 1726, (May/Jun. 1990).

*IBM Technical Disclosure Bulletin*, vol. 34, No. 11, pp. 237–238, (Apr. 1992).

Selwyn, "Plasma Particulate Contamination Control 1. Transport and Process Effects", *J. Vac. Sci. Technol. B.*, vol. 9, No. 6, pp. 3487–3492, (Nov./Dec. 1991).

Selwyn et al., "Plasma Particulate Contamination Control: II. Self Cleaning Tool Design", *Journal of Vacuum Technology A (Vacuums, Surfaces and Films)*, vol. 10, No. 8, pt. 1, pp. 1053–1059, (Jul. 1992).

*Primary Examiner*—Jeffrey E. Russel
*Attorney, Agent, or Firm*—Townsend & Townsend & Crew

[57] ABSTRACT

A method and apparatus for preventing particles from dislodging from the interior of a process chamber by preventing DC bias spikes. Such DC bias spikes can be caused by variations in the power or pressure in a process chamber. DC bias spikes are prevented by ramping changes in the pressure at a rate which avoids the creation of such spikes. RF power is ramped down at a rate which avoids spikes.

31 Claims, 3 Drawing Sheets

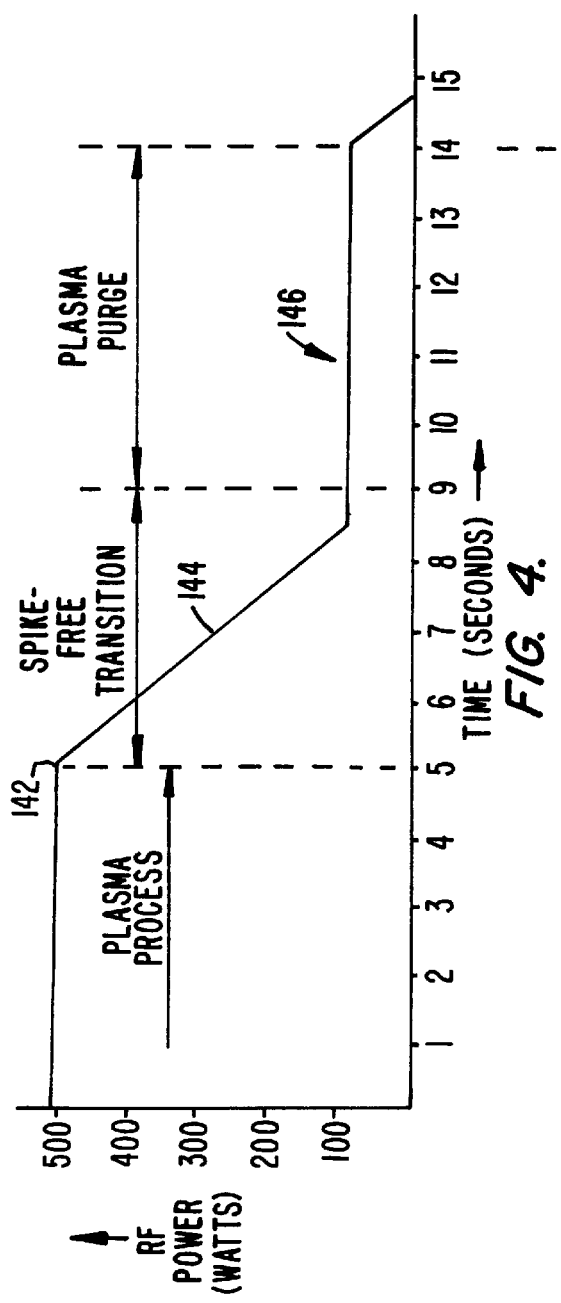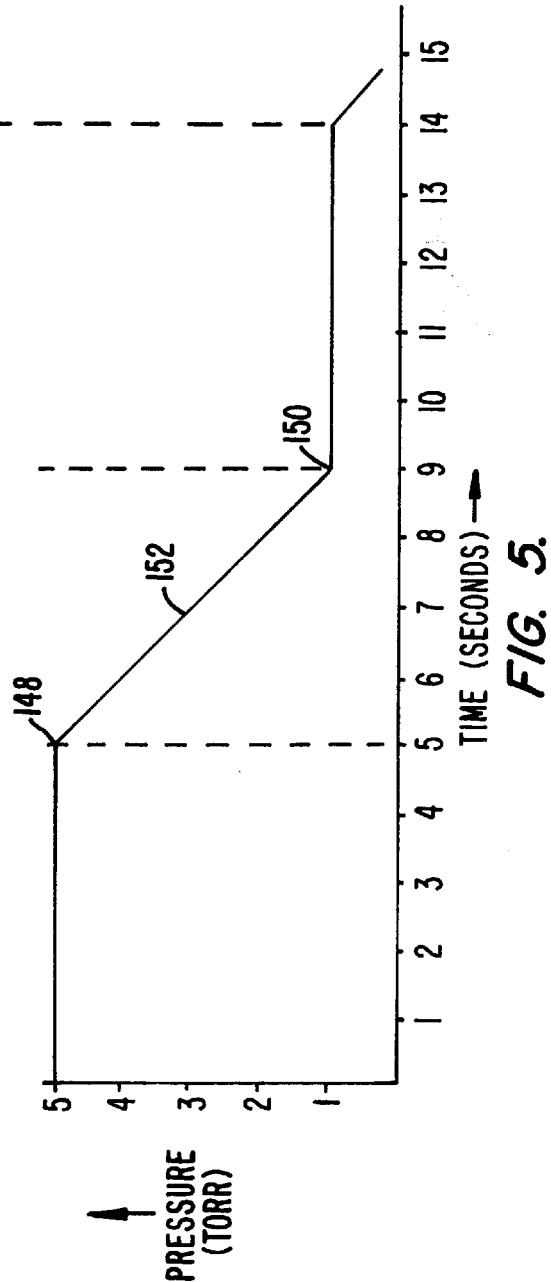

METHOD AND APPARATUS FOR REDUCING PARTICLE GENERATION BY LIMITING DC BIAS SPIKE

CROSS-REFERENCE TO RELATED APPLICATION

This application is related to the following concurrently filed patent applications which are assigned to Applied Materials, Inc, and incorporated herein by reference: METHOD AND APPARATUS FOR REDUCING PARTICLE CONTAMINATION IN A SUBSTRATE PROCESSING CHAMBER, inventor Anand Gupta, and METHOD AND APPARATUS FOR IMPROVING THE FILM QUALITY OF PLASMA ENHANCED CVD FILMS AT THE INTERFACE, inventors Anand Gupta, Virendra Rana, Amrita Verma, Mohan Bhan, and Sudhakar Subrahmanyam.

BACKGROUND OF THE INVENTION

The present invention relates to the fabrication of integrated circuits. More particularly, the invention provides a technique, including a method and apparatus, for preventing particle generation from interior surfaces of a chemical vapor deposition (CVD) treatment chamber. The present invention also may be applied to an apparatus for plasma-enhanced CVD (PECVD), plasma etching, physical vapor deposition (PVD), and the like.

In the manufacture of high density integrated circuits, commonly termed VLSI devices, contaminant particles are a major problem. In particular, contaminant particles attach themselves to unpassivated elements of integrated circuit devices during fabrication, where they can create short circuits or cause reliability problems. Therefore, the contaminant particles ultimately reduce the yield of good dies on a conventional semiconductor wafer. Even worse, as feature sizes decrease, the influence of contaminant particles in the fabrication of integrated circuits becomes greater.

Accordingly, semiconductor equipment vendors and users, alike, often rely upon elaborate and expensive techniques to control potential sources of contaminant particles. Such techniques include the use of ultra-clean rooms, super automated handling equipment, and sophisticated process controls during the fabrication of integrated circuits to reduce the potential sources of contaminant particles. However, such techniques can only be of limited success because substantial amounts of contaminant particles in integrated circuit fabrication are actually derived from reactant by-products created when semiconductor wafers undergo processing.

These reactant by-products often attach themselves to interior surfaces of a process chamber and form into a thick contaminant residue layer. Typically, the contaminant residue layer is derived from by-products of reactant gases and other by-products already attached to interior surfaces of the process chamber. Portions of the contaminant residue layer can flake off and deposit onto unpassivated surfaces of the integrated circuit, thereby damaging such integrated circuit by causing short circuits, broken connections, missing elements, and reliability problems.

In a conventional silicon dioxide deposition process, for example, the reactant gases used may be mixtures of organic silane or TetraEthylOrthoSilicate (TEOS) and ozone. These gases are introduced into the chamber to form a silicon dioxide layer on surfaces of a semiconductor wafer. As the silicon dioxide layer is formed, however, these gases also form particulate compositions. The particulate compositions form loosely attached contaminant residues on the interior surfaces of the process chamber. These interior surfaces of the chamber include a gas dispersion head, electrodes, walls, and any other exposed surfaces. The loosely attached contaminant residues often form into a thicker contaminant residue layer, which is likely to flake off and fall onto the integrated circuit.

To prevent portions of the contaminant residue layer from damaging the integrated circuit, a variety of cleaning techniques have been used. These cleaning techniques require separate process steps, which include machine shut-down and cleaning, after each deposition step. This is time consuming, expensive, and difficult to achieve. Of course, when the system is not operating, its throughput drops, rendering the manufacturing process all the more expensive.

An example of a conventional cleaning technique for a silicon dioxide deposition apparatus involves sequential steps of machine shut-down, dismantling portions of the process chamber, and hand wiping interior surfaces of the process chamber using appropriate materials, e.g. rinse water and clean wipes. The hand wiping step attempts to remove contaminant residues from the interior surfaces. Other conventional cleaning techniques sometimes used rely upon hand wiping the interior surfaces of the process chamber with a liquid chemical solution, such as a dilute hydrofluoric acid solution, or an organic solvent, in an attempt to dissolve and remove the contaminant residues. These conventional cleaning techniques also are applied to vacuum exhaust channels and pump systems because diminished vacuum or suffocation often occurs with accumulated residues or contaminant clogging. The conventional techniques are time consuming, and generally provide additional sources for even more contamination.

Plasma enhanced dry cleaning techniques have also been used to remove contaminant residues from interior surfaces of a deposition chamber. The dry cleaning techniques often take place during a separate process step, for example, by introducing cleaning gases into a process chamber, striking a plasma from the cleaning gases, and using the plasma to remove contaminant residues. Preferably, ionic species in the plasma combine with the contaminant residues to form volatile products which are removed from the process chamber. The dry cleaning techniques typically are used after every deposition run to be effective in keeping the interior surfaces of the process chamber substantially free from contaminant residues.

Another method for in-situ cleaning is set forth in U.S. Pat. No. 5,427,621, assigned to Applied Materials, Inc. That patent recognizes that a quick change in a magnetic field will generate a DC bias voltage spike to dislodge particles from the interior surfaces of a processing chamber. The magnetic field traps electrons released in a plasma cloud in the magnetic field. A sudden change in the magnetic flux density allows electrons suddenly released and their associated ions to bombard the inside surfaces of the process chamber to dislodge any film or particulate contaminants coating the chamber walls.

A method for removing particle contaminants is set forth in another application in which one co-inventor of the present application is also a co-inventor, U.S. Ser. No. 07/899,539, filed Jun. 16, 1992, abandoned, and a CIP of that application filed Nov. 29, 1993, abandoned, U.S. Ser. No. 08/158,243, with an FWC filed Nov. 20, 1995, U.S. Ser. No. 08/559,855, issued Apr. 22, 1997 as U.S. Pat. No. 5,622,595. Those two applications discuss preventing particles formed during a plasma or dislodged during a plasma from depositing on a wafer at the end of the plasma process when the plasma is turned off. This is done by a plasma purge, in which reactants are turned off while maintaining a purge gas flow at a reduced pressure, but with a plasma maintained to keep particles suspended. The gas flow is then used to purge the suspended particles from the plasma before turning off the plasma.

Another method is set forth in U.S. Pat. No. 5,456,796, issued Oct. 10, 1995, assigned to Applied Materials, Inc. One embodiment set forth in that patent provides for a gradual increase in RF power upon plasma initiation to avoid stirring up and circulating particles within the reaction chamber.

SUMMARY OF THE INVENTION

The present invention provides a method and apparatus for preventing particles from dislodging from the interior of a process chamber by preventing DC bias spikes. Such DC bias spikes can be caused by variations in the power or pressure in a process chamber. DC bias spikes are prevented by ramping changes in the pressure at a rate which avoids the creation of such spikes. In addition, it has been discovered that ramping down changes in RF power upon removing or reducing RF power can limit particle generation, just as it does for plasma initiation.

A DC bias spike can cause particle contamination by two methods. First, particles in the plasma can be accelerated into the wafer by a bias spike. Second, the DC bias spike can cause ions to impact the chamber walls and loosen particles which can then contaminate a wafer.

Preferably, DC bias spikes are prevented by controlling pressure changes to be less than 2 torr per second. RF power changes are ramped down at a rate less than 200 watts per second.

In one embodiment, a plasma purge is used at the end of a plasma process, and the pressure and power are varied from the process parameters to the purge parameters at a ramping rate which avoids DC bias spikes, thus furthering the effectiveness of the plasma purge. However, the ramping procedure of the present invention can be applied to any process step in which there is a change either positively or negatively in the pressure, or a negative change in the power.

For a further understanding of the objects and advantages of the present invention, reference should be made to the ensuing detailed description taken in conjunction with the accompanying drawings.

BRIEF DESCRIPTION OF THE DRAWINGS

FIG. 4 is a timing diagram illustrating the ramping of the RF power according to one embodiment of the present invention; and FIG. 5 is a timing diagram illustrating the ramping of pressure according to one embodiment of the present invention.

DETAILED DESCRIPTION OF THE PREFERRED EMBODIMENT

Figure 1:
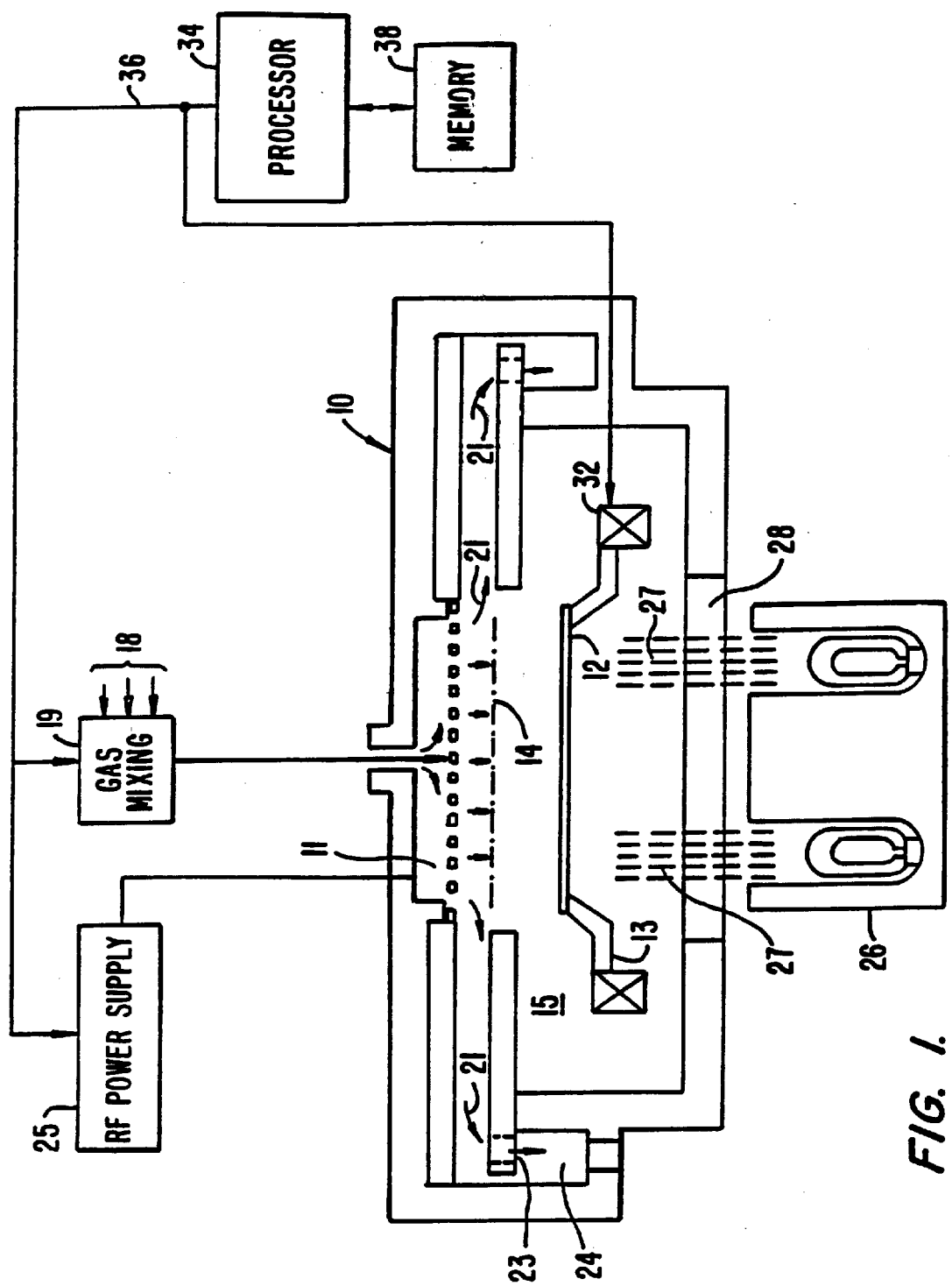
FIG. 1 is a diagram of a PECVD chamber used according to the present invention.

One suitable CVD machine in which the method of the present invention can be carried out is shown in FIG. 1 which is a vertical, cross-sectional view of a simplified, parallel plate chemical vapor deposition reactor 10 having a vacuum chamber 15. Although a lamp-heated chamber is shown, alternately a resistive heated or any other type of chamber may be used. Reactor 10 contains a gas inlet manifold 11 for dispersing deposition gases to a wafer, not shown, that rests on a susceptor 12. Susceptor 12 is highly thermally responsive and is mounted on a support fingers 13 so that susceptor 12 (and the wafer supported on the upper surface of susceptor 12) can be controllably moved between a lower loading/off-loading position and an upper processing position 14 which is closely adjacent manifold 11.

When susceptor 12 and the wafer are in processing position 14, they are surrounded by a baffle plate having a plurality of spaced holes 23 which exhaust into an annular vacuum manifold 24. During processing, gas inlet to manifold 11 is uniformly distributed radially across the surface of the wafer as indicated by arrows 21. The gas is then exhausted via ports 23 into the circular vacuum manifold 24 by a vacuum pump system (not shown). Before reaching manifold 11, deposition and carrier gases are input through gas lines 18 into a mixing system 19 where they are combined and then sent to manifold 11.

The deposition process performed in reactor 10 can be either a thermal process or a plasma enhanced process. In a plasma process, a controlled plasma is formed adjacent to the wafer by RF energy applied to inlet manifold 11 from RF power supply 25 (with susceptor 12 grounded). Inlet manifold 11 is also an RF electrode, while susceptor 12 is grounded. RF power supply 25 can supply either single or mixed frequency RF power to manifold 11 to enhance the decomposition of reactive species introduced into chamber 15.

An external lamp module 26 provides a collimated annular pattern of light 27 through quartz window 28 onto an annular outer peripheral portion of susceptor 12. Such heat distribution compensates for the natural heat loss pattern of the susceptor and provides rapid thermal and uniform susceptor and wafer heating for effecting deposition.

Typically, any or all of the chamber lining, gas inlet manifold faceplate, support fingers 13, and various other reactor hardware is made out of material such as aluminum or anodized aluminum. An example of such a CVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention, which is incorporated herein by reference for all purposes.

A motor 32 raises and lowers susceptor 12 between a processing position 14 and in a lower, wafer-loading position. Motor 32, gas mixing system 19 and RF power supply 25 are controlled by a processor 34 over control lines 36. Processor 34 operates under the control of a computer program stored in a memory 38. The computer program dictates the timing, mixture of gases, RF power levels, susceptor position, and other parameters of a particular process.

Figure 2:
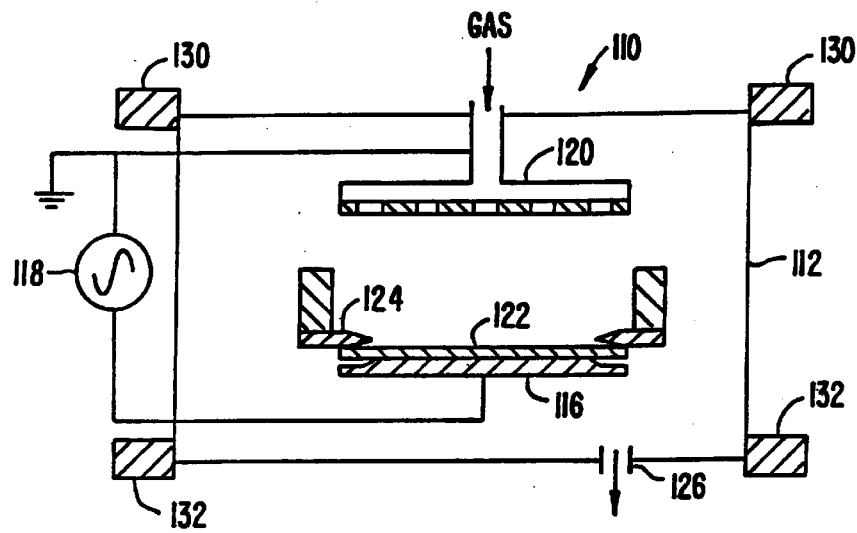
FIG. 2 is a diagram of a process chamber with a magnetic flux generator used according to one embodiment of the present invention.

FIG. 2 shows a schematic view, partly in section, of a plasma processing chamber equipped with magnetic field enhancement. FIG. 2 depicts a plasma etch reactor 110 including a housing, typically made of a non-magnetic material such as aluminum, which defines a plasma processing chamber 112. A substrate support 116 which is also a cathode is connected to a radio-frequency generator 118 which is in turn connected to a gas inlet shower head or the anode 120. Processing gases are supplied to chamber 112 through the gas inlet shower head (or manifold plate) 120. A semiconductor substrate 122 to be processed is positioned on the substrate support or cathode 116. The substrate 122 is held against cathode 116 by means of a clamping ring 124. During plasma processing, substrate 122 heats up and must be cooled by a cooling gas which is supplied by unillustrated means and which transfer heat to the water cooled support 116. The clamping ring 124 is therefore required to hold the substrate down against the pressure developed by the cooling gas. An exhaust port 126 connected to a vacuum pump (not shown) evacuates the chamber. An upper rotating magnet 130 and a lower rotating magnet 132 function together to provide a magnetic field inside the process chamber 112. Other magnetic field generating means such as stationary coils may also be used.

Figure 3:
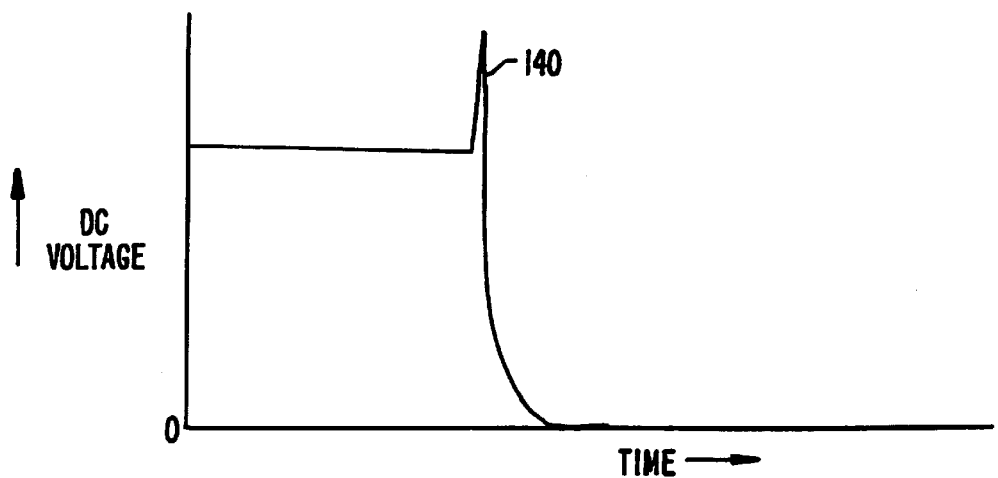
FIG. 3 is a timing diagram illustrating the generation of a DC bias spike.

In the chamber shown in FIGS. 1 and 2, a plasma is generated between the gas discharge head and the susceptor using a glow discharge effect. The glow discharge, or plasma, is generated using an applied RF potential or a magnetic field, or both, in combination with a gas stream providing the gas particles for forming the plasma at specified pressure and temperature conditions. A DC bias is established as a result between the susceptor and the gas discharge head. As pointed in U.S. Pat. No. 5,427,621, discussed in the background, a change in the magnetic field can cause a DC bias spike. The inventor has determined that such a spike can also be caused by sudden changes in other parameters affecting the plasma, in particular the RF power applied and the pressure in the chamber. A change in the pressure will change the mean free path in the plasma. If the pressure is suddenly reduced, electrons and ions can go much further, thus increasing the DC bias and causing a spike. The pressure affects the DC bias since the charge density varies with pressure. FIG. 3 is an illustration of a DC spike 140 that can be caused by such a sudden change in parameter conditions.

U.S. Pat. No. 5,427,621 discusses using the DC spike generated by a magnetic field to remove particles during a cleaning process. When this effect occurs unintentionally during a process step, particles are also removed, but this is undesirable since the particles can then land on the wafer substrate and contaminate it. The inventor has determined that by appropriately ramping the pressure during a transition, DC spikes can be avoided, thus reducing the count of particles generated during transitions. U.S. Pat. No. 5,456,796 discusses initiating a plasma in a ramped manner to avoid particle generation. The inventor has also determined that particle generation can be avoided by ramping down the RF power, in particular for a transition to a plasma purge operation. FIGS. 4 and 5 illustrate a ramping transition for RF power and pressure during a transition from a plasma process to a plasma purge. As shown in FIG. 4, the plasma process is operated with an RF power of 510 watts. At the completion of the plasma process at a point in time 142, instead of a quick transition to the plasma purge wattage of 100 watts, a ramping transition is made, as indicated by sloped line 144. This is done at a rate of −150 watts per second. Other rates can be used as well, but preferably a rate of less than 200 watts per second is used. Additionally, although FIG. 4 shows a constant ramp down rate during the transition period, the actual rate employed may vary during this period. Subsequently, the plasma purge occurs during a period of time 146, as discussed in the background, to purge particles suspended in the plasma.

FIG. 5 similarly shows the pressure being ramped from the plasma process pressure of 5 torr at a point 148 at the end of the plasma process down to the plasma purge pressure of 1 torr at a point 150. Preferably, the pressure is ramped down at a rate of 1 torr per second, as indicated by slope 152. Other pressure rates may be used, but preferably a rate of change of 2 torr per second or less is used. Additionally, although FIG. 5 shows a constant pressure decrease rate during the transition period, the actual rate employed may vary during this period. It should be kept in mind that the different parameters are interrelated, and that a difference in the rate of ramping in one parameter will affect the optimum ramping rate for another parameter.

In one example, a silicon dioxide film may be deposited in a plasma process using helium, oxygen and silicon in the form of TEOS (tetraethylorthosilicate). As one example, the process may be operated at a pressure of 5 torr and a RF power of 510 watts. The helium gas flow will be at a rate of 560 sccm, the oxygen at 840 sccm, and the TEOS at 800 mgm. Upon completion of the plasma process for depositing the desired silicon dioxide film, a transition according to the present invention is made to a plasma purge state at a pressure of 1 torr, and RF power at 100 watts, and a gas flow of 2200 sccm for oxygen, with the helium and TEOS being turned off.

The ramping to the purge state is done at a rate of 1 torr per second for the pressure and 150 watts per second for the power. The helium and TEOS are turned off and the oxygen flow is increased from 840 to 2200 sccm. The increased flow of oxygen makes up for the absence of the flow of helium and TEOS, thus maintaining the plasma gas volume needed.

The pressure is controlled by adjustment of a valve connected to the vacuum manifold and controlled by processor 34 of FIG. 1. The RF power is controlled by processor 34 sending control signals to RF power supply 25, as shown in FIG. 1. Similarly, the gas flow rate is controlled by gas mixing system 19 of FIG. 1 through the controller to increase the flow of a gas stream to carry the elevated particles away from the surface of the substrate. In a preferred embodiment, the controller is programmed to ramp down the pressure and RF power to values that maintain a plasma in the chamber so that particles are elevated above the substrate.

The particle reduction by eliminating the DC spikes has been experimentally analyzed by comparing a process without the ramping to avoid the DC spikes with one including the ramping. It has been found that the number of particles greater than 0.21 micrometers has been reduced by 75%.

Although FIGS. 4 and 5 illustrate a transition from a plasma process to a plasma purge, the ramping steps of the present invention can be applied to any step in a process where the parameters are varied, including an intermediate variation in a process.

As will be understood by those of skill in the art, the present invention may be embodied in other specific forms without departing from the spirit or essential characteristics thereof. The foregoing description is merely illustrative of the present invention, the scope of which is set forth in the appended claims.

What is claimed is:

1. A method for preventing contamination of a substrate by particles in a substrate processing chamber, the method comprising:

introducing said substrate into said chamber;

flowing processing gases into said chamber;

applying an RF field to the chamber to form a plasma; and reducing the power of the RF field applied to said chamber at a first selected ramping rate while ramping the pressure in said chamber to a desired value at a second selected ramping rate slow enough to avoid a direct-current ("DC") bias spike.

2. The method of claim 1 wherein said first rate is less than 200 watts per second.

3. The method of claim 1 wherein said first rate is between 100 and 200 watts per second.

4. The method of claim 1 wherein said second rate is less than 2 torr per second.

5. The method of claim 4 wherein said second rate is between 0.5 and 2 torr per second.

6. The method of claim 1 wherein said ramping the pressure step occurs between a processing step and a chamber purge step.

7. A method for preventing contamination of a substrate with particles in a substrate processing chamber, the method comprising:

introducing said substrate onto a substrate support in said chamber;

introducing processing gases into said chamber through a gas discharge head;

applying RF power between said substrate support and said gas discharge head;

pressurizing said chamber to a desired processing pressure;

ramping down said RF power at a rate between 100 and 200 watts per second; and ramping down said pressure at a rate between 0.5 and 2 torr per second.

8. A substrate processing apparatus comprising:

a substrate support for supporting a substrate in a chamber of the substrate processing apparatus;

a gas discharge head for introducing processing gases into the chamber; and a controller configured to ramp a chamber pressure from a first selected pressure to a second selected pressure at a selected rate, the selected rate being slow enough to avoid a direct-current ("DC") bias spike.

9. The apparatus of claim 8 further comprising an RF generator for applying RF power between said gas discharge head and said substrate support, and wherein said controller is further configured to ramp said RF power at a rate less than 200 watts per second.

10. The apparatus of claim 9 wherein said RF power is ramped at a rate between 100 and 200 watts per second.

11. The apparatus of claim 8 wherein said chamber pressure is ramped at a rate less than 2 torr per second.

12. The apparatus of claim 11 wherein said chamber pressure is ramped at a rate between 0.5 and 2 torr per second.

13. The apparatus of claim 8 wherein said ramping occurs between a processing step and a chamber purge step.

14. The apparatus of claim 9 wherein said controller ramps down the chamber pressure and the RF power during a time period.

15. A substrate processing apparatus, comprising:

a substrate support configured to support a substrate in a chamber;

a gas discharge head for introducing processing gases into said chamber;

an RF power supply coupled between said substrate support and said gas discharge head; and a controller coupled to said chamber, said controller being programmed for pressurizing said chamber to a desired processing pressure, ramping down said RF power at a rate between 100 and 200 watts per second, and ramping down said pressure at a rate between 0.5 and 2 torr per second.

16. The apparatus of claim 15 wherein said controller is further programmed for:

ramping down said pressure and RF power to values that maintain a plasma in the chamber so that particles are elevated above the substrate; and increasing the flow of a gas stream to carry the elevated particles away from the surface of the substrate.

17. A method for preventing contamination of a substrate with particles in a substrate processing chamber, the method comprising:

introducing said substrate into said chamber;

flowing processing gases into said chamber;

applying an RF field to said chamber at a first selected RF power, the first selected RF power being sufficient to create a plasma within said chamber;

ramping the first selected RF power to a second selected RF power at a rate between about 100–200 Watts per second, the second selected RF power being less than the first selected RF power, the rate being slow enough to avoid a direct-current ("DC") bias spike.

18. The method of claim 17 further comprising, after said applying step, a processing step; and, after said ramping step a chamber purge step.

19. A method for preventing contamination of a substrate with particles in a substrate processing chamber, the method comprising:

placing said substrate onto a substrate support in said chamber;

flowing processing gases into said chamber through a gas discharge head;

applying RF power between said substrate support and said gas discharge head; and ramping down said RF power at a rate between 100 and 200 watts per second to avoid a direct-current bias spike.

20. A substrate processing apparatus comprising:

a substrate support configured to support a substrate within a chamber;

a gas discharge head for introducing processing gases into said chamber;

an RF generator for applying RF power between said gas discharge head and said substrate support; and a controller configured to ramp said RF power down at a rate between about 100–200 watts per second to avoid a direct-current bias spike.

21. A substrate processing apparatus, comprising:

a substrate support configured to support a substrate in a chamber;

a gas discharge head for introducing processing gases into said chamber;

an RF power supply coupled between said substrate support and said gas discharge head; and a controller coupled to said chamber, said controller being programmed for pressurizing said chamber to a desired processing pressure, and ramping down said RF power at a rate between 100 and 200 watts per second to avoid a direct-current bias spike.

22. The apparatus of claim 21 wherein said controller is further programmed for:
- ramping down said RF power to a value that maintains a plasma in the chamber so that particles are elevated above the substrate; and
- increasing the flow of a gas stream to carry the elevated particles away from the surface of the substrate.

23. A method for reducing particulate contamination of a substrate in a processing chamber, the method comprising:
- flowing a process gas into the processing chamber to establish a chamber pressure;
- applying RF power to the processing chamber to form a plasma;
- decreasing the chamber pressure from a first chamber pressure to a second chamber pressure at a selected rate slow enough to avoid a direct-current ("DC") bias spike, while maintaining the plasma in the chamber.

24. The method of claim 23 wherein the selected rate is less than 2 torr per second.

25. The method of claim 23 wherein the first chamber pressure is 5 torr and the second chamber pressure is 1 torr.

26. The method of claim 7 wherein the substrate support is a susceptor.

27. The apparatus of claim 8 wherein the substrate support is a susceptor.

28. The apparatus of claim 15 wherein the substrate support is a susceptor.

29. The method of claim 19 wherein the substrate support is a susceptor.

30. The apparatus of claim 20 wherein the substrate support is a susceptor.

31. The apparatus of claim 21 wherein the substrate support is a susceptor.

* * * * *